United States Patent [19]
Robinson et al.

[11] 4,350,623
[45] Sep. 21, 1982

[54] PHENOLATED NAPHTHALENE FORMALDEHYDE RESIN VARNISH

[75] Inventors: Joseph G. Robinson, Winchcombe; Sally A. Brain, Evesham, both of England

[73] Assignee: Coal Industry (Patents) Limited, London, England

[21] Appl. No.: 236,064

[22] Filed: Feb. 19, 1981

[30] Foreign Application Priority Data

Mar. 25, 1980 [GB] United Kingdom ............... 8009948

[51] Int. Cl.³ .............................................. C08K 5/05
[52] U.S. Cl. ................................... 524/391; 525/472; 528/160; 428/290; 524/542
[58] Field of Search ................... 260/33.4 R; 525/472; 528/160; 428/290

[56] References Cited

U.S. PATENT DOCUMENTS 2,339,271  1/1944  Kester .................................. 260/19
2,825,712  3/1958  Witzel .................................. 260/43
3,993,851  11/1976  Robinson et al.

FOREIGN PATENT DOCUMENTS 2043662  10/1980  United Kingdom.

Primary Examiner—Joseph L. Schofer
Assistant Examiner—Bernard Lipman
Attorney, Agent, or Firm—Stevens, Davis, Miller & Mosher

[57] ABSTRACT

The varnish comprises a phenolated naphthalene formaldehyde resin having a molecular weight from 350 to 500 and a combined phenol content from 37 to 54%, a curing agent for the resin, and a lower secondary alcohol as the solvent, the varnish containing about 50% w/w of the resin. The varnish can be used to form glasscloth laminates for the production of printed circuit boards, copper clad laminates and blading for turbines.

6 Claims, No Drawings

PHENOLATED NAPHTHALENE FORMALDEHYDE RESIN VARNISH

This invention relates to a novel varnish for use in preparing glasscloth laminates which are stable at high temperatures. In particular, the varnish comprises a phenolated naphthalene formaldehyde resin.

It is known that certain specially prepared toluene formaldehyde resins can be used to form glasscloth laminates which are stable at relatively high temperatures, (up to about 250° C.). This is shown in our British Patent Application No. 7,907,384. A varnish is formed by dissolving the resin and a curing agent such as hexamine, in an organic solvent. Glasscloth sheets are impregnated with the varnish, stacked on top of one another and heated under pressure to effect curing. The laminate thus formed is strong and retains its strength at elevated temperatures. In this process, a wide variety of solvents and a wide range of resins can be used to form the varnish.

It was desired to prepare similar laminates from phenolated naphthalene formaldehyde resin varnish, since it was thought that the presence of the naphthalene nucleus in the resin would enhance the thermal stability and upgrade the electrical properties of the resulting laminates. However, when a laminate was prepared using a naphthalene formaldehyde resin in an analagous way to that in the application mentioned above, it was found that in most cases satisfactory laminates could not be formed. On post curing at 175° C. they blistered and lost some of their mechanical strength. However, occasionally satisfactory laminates were formed. We therefore carried out a research programme to select the properties of the varnishes which would produce satisfactory laminates. As a result of the research programme it has been discovered that a narrow range of novel varnishes produce satisfactory glasscloth laminates for use at high temperatures.

Therefore according to the present invention there is provided a varnish for preparing glasscloth laminates for use at high temperatures, comprising a phenolated naphthalene formaldehyde resin having a molecular weight from 350 to 500 and a combined phenol content from 37 to 54%, a curing agent for the resin, and a lower secondary alcohol as the solvent, the varnish containing about 50% w/w of the resin.

It has been found that the essential parameters for the varnish are the combined phenol content and molecular weight of the resin and the choice of the solvent. The concentration of the resin in the solution is not critical, but should be chosen so as to strike a balance between the amount of resin in the solution and the viscosity thereof.

Preferably, the naphalene formaldehyde resin is made by reacting naphthalene with formaldehyde or a formaldehyde donor such as formalin (37% formaldehyde in water), trioxane (a trimer of formaldehyde) or paraform-aldehyde (a solid polymer of formaldehyde and water containing about 87% formaldehyde) in the presence of an acid catalyst, such as 50% sulphuric acid or aluminium chloride. The naphthalene formaldehyde resin should have an oxygen content from about 8 to 10% and a number average molecular weight of about 500. To this end, the molar ratios of naphthalene to formaldehyde and naphthalene to acid catalyst should be about 1:3 and 1.8:1 respectively.

The reaction between the naphthalene formaldehyde resin and phenol should be carried out in the presence of an acid catalyst, such a para-toluene sulphonic acid at an elevated temperature, for instance about 100° C. After the reaction, unreacted phenol should preferably be removed from the resin.

Preferably the curing agent is hexamethylenetetramine (hexamine) although other known curing agents may be used, and the preferred solvent is iso-propyl alcohol (propan-2-ol).

It is envisaged that the varnish will be used to prepare glasscloth laminates which will be useful in producing printed circuit boards, copper clad laminates, and blading for turbines, and the invention also includes such products made using the varnish.

The invention will now be described by way of example only, with reference to the following procedure which was carried out as far as possible in each experiment.

PROCEDURE

A naphthalene formaldehyde resin was prepared by reacting naphthalene and formaldehyde (at a given molar ratio) in the presence of 50% sulphuric acid (molar ratio to naphthalene given) at a temperature of 100° C. for 4 hours. The properties of the naphthalene formaldehyde resin are given.

15 parts of the naphthalene formaldehyde resin were dissolved in toluene and added to 25 parts of phenol containing 0.045 parts of para-toluene sulphonic acid held at 100° C. The rate of addition of the naphthalene formaldehyde resin solution was controlled so that the exotherm did not exceed 5 centigrade degrees. When all the naphthalene formaldhyde resin solution had been added the reaction was continued at 100° C. for one hour. Thereafter, the temperature was raised to 160°–175° C. and unreacted phenol was distilled off in steam. The combined phenol content and number average molecular weight of the phenolated resin is given.

The phenolated resin was then dissolved in a solvent to give a 50% w/w solution to which was added 10% (based on the weight of the phenolated resin) of hexamine dissolved in the minimum amount of water. The varnish so formed was used to prepare glasscloth laminates as follows.

Five sheets, each 304 mm. square were cut from a roll of glasscloth using a sharp knife. Each sheet was placed on a glass plate and about 40 g of varnish poured on it. A hand roller was drawn across the sheet several times to ensure even impregnation of the fabric and to remove excess varnish.

The impregnated sheets were freely suspended and air dried for about 1 hour after which they were precured for a fixed time in an air-circulating oven at about 135° C. Each sheet was cut into 4 equal squares and the 20 sheets thus obtained were stacked one on top of each other between plates lined with aluminum foil. The stack of sheets was pressed at 175° C. in a hydraulic press. The initial pressure was 3.4 MN/mm$^2$ which was allowed to fall progressively to 1.13 MN/mm$^2$ over the one hour dwell period. At the end of this time the laminate was cooled to room temperature and was then subject to a post-curing schedule.

Rectangular test pieces 12.5 mm. wide and of length approximately 27 times their thickness milled from the cured laminates were supported at one end and freely suspended in an air oven and post-cured as follows:

16 hours at 175° C.

4 hours from 175° C. to 200° C.
21 hours at 200° C.
8 hours from 200° C. to 250° C.

When the post-cure schedule was complete some samples were removed from the oven, the remainder being retained in the oven at 250° C. for different periods to effect heat ageing.

EXPERIMENT 1

| | |
|---|---|
| Naphthalene:Formaldehyde molar ratio | = 1:2.5 |
| Naphthalene:Acid Catalyst ratio | = 1.8:1 |
| Naphthalene formaldehyde resin - Oxygen content | = 8.7% |
| Number average molecular weight | = 510 |
| Phenolated resin - Combined phenol content | = 42% |
| Number average molecular weight | = 390 |
| Varnish solvent - Iso-propyl alcohol | |

Satisfactory laminates were made with this varnish. They did not blister at any stage of their production of during the post curing schedule up to 250° C. They retained their cross-breaking strength after heat ageing at 250° C. for 1000 hours.

EXPERIMENT 2

| | |
|---|---|
| Naphthalene:formaldehyde molar ratio | = 1:2.5 |
| Naphthalene:Acid Catalyst ratio | = 1.8:1 |
| Naphthalene formaldehyde resin - Oxygen content | = 8.5% |
| Number average molecular weight | = 520 |
| Phenolated resin - Combined phenol content | = 40% |
| Number average molecular weight | = 490 |
| Varnish solvent - Iso-propyl alcohol | |

Satisfactory laminates were made with this varnish. They did not blister or crack at any stage of their production or during the post curing schedule up to 250° C. They retained their cross-breaking strength after heat ageing at 250° C. for 1000 hours.

EXPERIMENT 3

As for experiment 2 except that the varnish solvent was acetone and not iso-propyl alcohol. In this case the laminate blistered severely at 175° C. during the initial stage of the post-curing schedule, therefore making it impossible to produce a satisfactory post-cured laminate.

EXPERIMENT 4

| | |
|---|---|
| Naphthalene:formaldehyde molar ratio | = 1:3 |
| Naphthalene:Acid catalyst molar ratio | = 2.0:1 |
| Naphthalene formaldehyde resin - Oxygen content | = 7.5% |
| Number average molecular weight | = 700 |
| Phenolated resin - Combined phenol content | = 32% |
| Number average molecular weight | = 560 |
| (In this case the excess phenol was removed using nitrogen instead of steam) | |
| Varnish solvent - Iso-propyl alcohol. | |

Laminates made with this varnish blistered severely at temperatures of 175° C. in the first stage of post-curing. Satisfactory laminates could not be prepared.

EXPERIMENT 5

| | |
|---|---|
| Naphthalene:formaldehyde molar ratio | = 1:3 |
| Naphthalene:Acid catalyst molar ratio | = 2.0:1 |
| Naphthalene formaldehyde resin - Oxygen content | = 7.5% |
| Number average Molecular weight | = 700 |
| Phenolated resin - Combined phenol content | = 31% |
| Number average molecular weight | = 670 |
| Varnish solvent - 70/30 (by volume) iso-propyl alcohol/acetone. | |

Laminates made with this varnish blistered severely after 16 hours at 175° C. during the post curing schedule.

EXPERIMENT 6

| | |
|---|---|
| Naphthalene:formaldehyde molar ratio | = 1:2.5 |
| Naphthalene:Acid catalyst molar ratio | = 1.8:1 |
| Naphthalene-formaldehyde resin | |
| Oxygen Content | 8.7% |
| Number Average Molecular Weight | 510 |
| Phenolated Resin | |
| Combined Phenol content | 29% |
| Number average molecular weight | 530 |
| Varnish Solvent - Iso-propyl alcohol | |

Laminates made with this varnish blistered severely on post-curing at 175° C.

It can thus be seen that by carefully selecting the properties of the varnish it is possible to prepare satisfactory glasscloth laminates which is not possible if the varnish does not comply with these criteria.

We claim:

1. A varnish for preparing glasscloth laminates for use at high temperatures comprising a solvent, about 50% w/w of a resin and a curing agent for the resin, wherein the solvent is a lower secondary alcohol and the resin consists essentially of a phenolated naphthalene formaldehyde resin having a molecular weight from 350 to 500 and a combined phenol content from 37 to 54% w/w.

2. A varnish according to claim 1, in which the naphthalene formaldehyde resin is made by reacting naphthalene and formaldehyde or a formaldehyde donor in the presence of an acid catalyst wherein the molar ratios of naphthalene to formaldehyde and naphthalene to acid catalyst are about 1:3 and 1.8:1 respectively.

3. A varnish according to claim 2, in which the naphthalene formaldehyde resin is reacted with phenol in the presence of an acid catalyst at a temperature of about 100° C.

4. A varnish according to claim 1, in which the curing agent is hexamine.

5. A varnish according to claim 1, in which the solvent is isopropyl alcohol.

6. A glasscloth laminate in which the glasscloth is embedded in a matrix comprising a curred varnish according to claim 1.

* * * * *